(12) United States Patent
Lian et al.

(10) Patent No.: US 11,081,597 B2
(45) Date of Patent: Aug. 3, 2021

(54) LATERAL SCHOTTKY DIODE WITH HIGH BREAKDOWN VOLTAGE CAPABILITY

(71) Applicant: Chengdu Monolithic Power Systems Co., Ltd., Chengdu (CN)

(72) Inventors: Yanjie Lian, Chengdu (CN); Daping Fu, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 139 days.

(21) Appl. No.: 16/709,919

(22) Filed: Dec. 10, 2019

(65) Prior Publication Data

US 2020/0185542 A1 Jun. 11, 2020

(30) Foreign Application Priority Data

Dec. 11, 2018 (CN) .......................... 201811511003.6

(51) Int. Cl.
*H01L 29/872* (2006.01)
*H01L 21/761* (2006.01)
*H01L 29/06* (2006.01)
*H01L 29/66* (2006.01)

(52) U.S. Cl.
CPC .......... *H01L 29/872* (2013.01); *H01L 21/761* (2013.01); *H01L 29/0623* (2013.01); *H01L 29/66143* (2013.01)

(58) Field of Classification Search
None
See application file for complete search history.

(56) References Cited

U.S. PATENT DOCUMENTS

| | | | |
|---|---|---|---|
| 6,261,932 B1 * | 7/2001 | Hulfachor | H01L 27/0635 257/E21.359 |
| 8,368,167 B1 | 2/2013 | Urienza | |
| 8,749,014 B2 | 6/2014 | Yoo | |
| 8,809,988 B2 | 8/2014 | Yoo et al. | |
| 2010/0187577 A1 * | 7/2010 | Lin | H01L 29/66143 257/280 |

* cited by examiner

*Primary Examiner* — Evren Seven
(74) *Attorney, Agent, or Firm* — Perkins Coie LLP

(57) ABSTRACT

A lateral diode with high breakdown voltage capability and a method for forming the lateral diode. The lateral diode has an anode, a cathode, a substrate having a first conductivity type, an epitaxial layer having formed on the substrate, a current region formed in the epitaxial layer and on the substrate, a first well coupled to the anode, a second well coupled to the cathode, a third well with light doping concentration formed beside the first well, and a guard ring with heavy doping concentration formed in the first well and beside the third well, and between the third well and the second well is a drift region, a lateral breakdown occurs in the third well, the drift region and the second well when a reverse voltage added on the lateral diode is equal to or higher than a breakdown voltage.

23 Claims, 7 Drawing Sheets

US 11,081,597 B2

LATERAL SCHOTTKY DIODE WITH HIGH BREAKDOWN VOLTAGE CAPABILITY

This application claims the benefit of CN application No. 201811511003.6, filed on Dec. 11, 2018, and incorporated herein by reference.

TECHNICAL FIELD

The present invention generally relates to semiconductor device, and more particularly but not exclusively relates to lateral Schottky diode with high breakdown voltage.

BACKGROUND

In integrated circuit technology, the Schottky diode has many important advantages over the regular diode such as low forward voltage drop, being majority carrier device, fast switching and so on. Meanwhile, it is required to enhance or to improve some performances of the Schottky diode, for example, a higher forward current, a lower leakage current, a higher breakdown voltage, etc.

FIG. 1 schematically depicts a cross-section structure of a typical vertical Schottky diode 100, wherein the Schottky diode 100 comprises an anode A and a cathode C. Conventionally, improving the breakdown voltage of the Schottky diode 100 requires increasing a thickness of an epitaxial layer, but this will increase the cost. In addition, the thickness of the epitaxial layer cannot be increased infinitely. For a typical vertical Schottky diode 100, doping concentration of a P-type guard ring structure 01 needs to be designed low to improve the breakdown voltage, however, too low doping concentration will affect its performance of forward current. Hence the breakdown voltage of a typical vertical Schottky diode 100 always cannot be high.

BRIEF SUMMARY

One embodiment of the present invention discloses a lateral diode, having an anode and a cathode, comprising: a substrate, having a first conductivity type; an epitaxial layer, having a second conductivity type, wherein the epitaxial is formed on the substrate; a current region, having the second conductivity type, the current region is formed in the epitaxial layer and on the substrate; a first buried layer, having the first conductivity type, wherein the first buried layer is formed beside the current region and in the epitaxial layer; a first well, having the second conductivity type, wherein the first well is coupled to the anode and is formed on the first buried layer and on the current region, wherein the first well touches the current region; a second well, having the second conductivity type, wherein the second well is coupled to the cathode and is formed on the current region; a third well, having the first conductivity type, wherein the third well is formed beside the first well and on the current region, wherein the third well does not touch the first buried layer; and a guard ring, having the first conductivity type, wherein the guard ring is formed in the first well and beside the third well.

One embodiment of the present invention discloses a lateral diode, having an anode and a cathode, comprising: a substrate, having a first conductivity type; an epitaxial layer, having a second conductivity type, wherein the epitaxial layer is formed on the substrate; a current region, having the second conductivity type, wherein the current region is formed in the epitaxial layer and on the substrate; a first well, having the second conductivity type, wherein the first well is coupled to the anode; a second well, having the second conductivity type, wherein the second well is coupled to the cathode; a third well, having the first conductivity type, wherein the third well is formed beside the first well and is with light doping concentration; and a guard ring, having the first conductivity type, wherein the guard ring is formed in the first well and beside the third well, wherein the guard ring is with heavy doping concentration; wherein between the third well and the second well is a drift region, and a lateral breakdown occurs in the third well, the drift region and the second well when a reverse voltage added on the lateral diode is equal to or higher than a breakdown voltage.

One embodiment of the present invention discloses a method for forming a lateral diode, wherein the lateral diode has an anode and a cathode, the method comprising: forming an epitaxial layer on a substrate, wherein the substrate has a first conductivity type and the epitaxial layer has a second conductivity type; forming a current region having a second conductivity type on the substrate and in the epitaxial layer; forming a first buried layer on the substrate and beside the current region; forming a first well and a second well on the current region, wherein the first well is coupled to the anode, the second well is coupled to the anode, and both the first well and the second well have the second conductivity type; forming a third well beside the first well, wherein the third well has the first conductivity type, and the third well does not touch the first buried layer; and forming a guard ring in the first well and beside the third well, wherein the guard ring has the first conductivity type and is with a heavy doping concentration.

BRIEF DESCRIPTION OF THE DRAWINGS

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

The use of the same reference label in different drawings indicates the same or like components.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Many details are described below with reference to substrate. The term "substrate" hereby is used throughout to comprise a various of articles of manufacture, comprising, for example, individual integrate circuit dies, sensor dies, discrete device dies, and/or dies having other semiconductor features. One of ordinary skill in relative art should also understand that the certain conductivity types of the semiconductor materials described in the following text are for the interpretation of certain embodiments. However, alternative conductivity types of the semiconductor materials may also apply according to other embodiments of the present invention.

Figure 1:
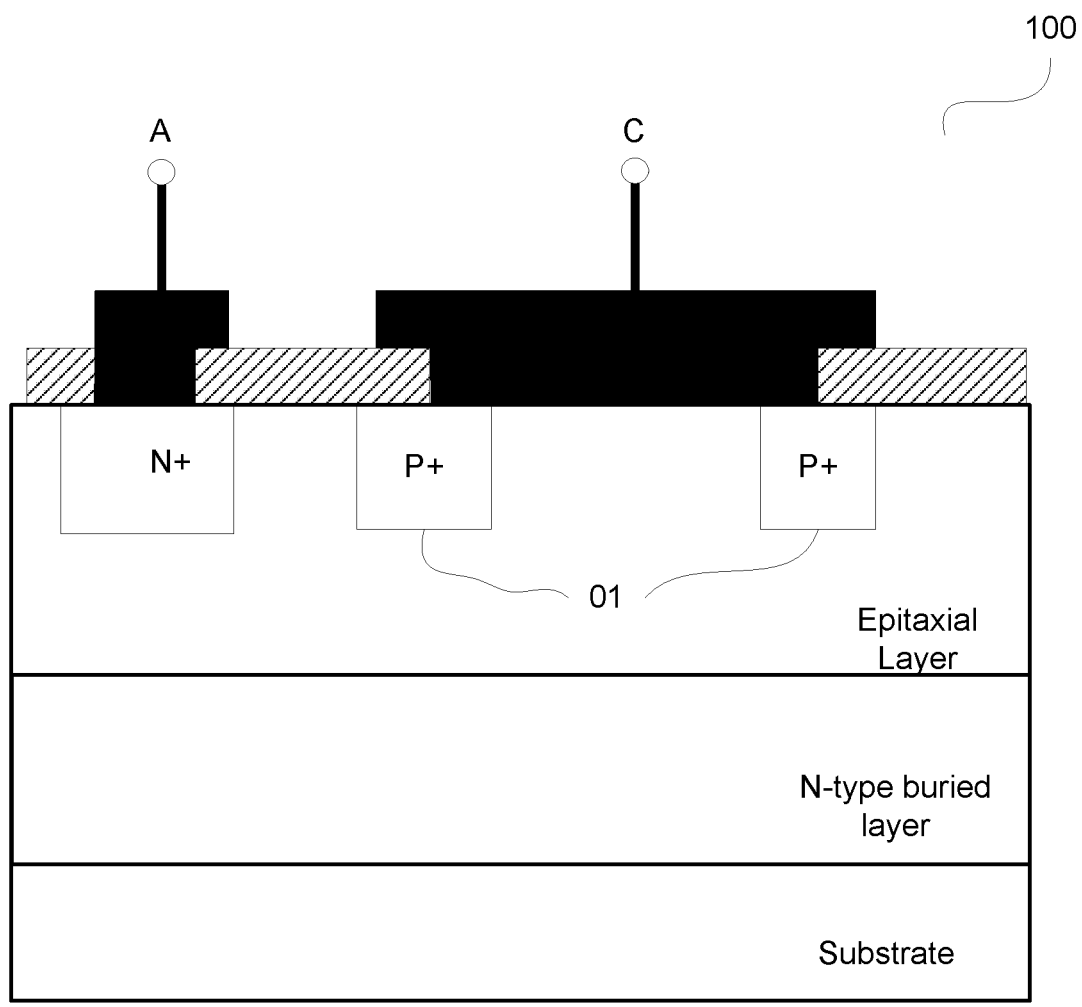
FIG. 1 illustrates a prior art cross-section structure of a typical vertical Schottky diode 100.
Figure 2:
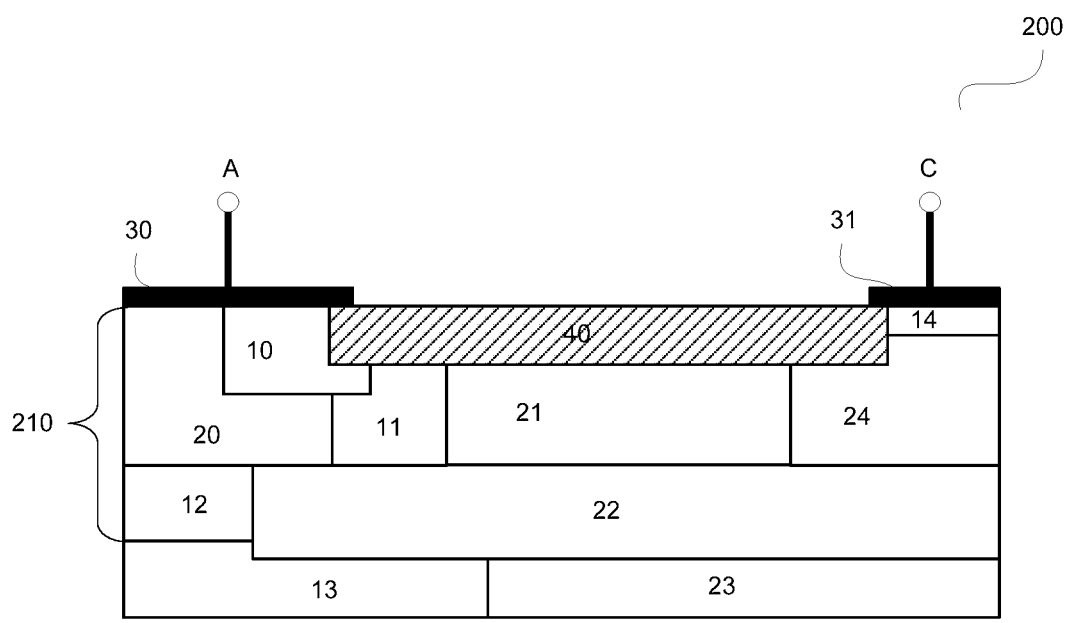
FIG. 2 schematically illustrates a cross-section view of a lateral Schottky diode 200 with high breakdown voltage in accordance with an embodiment of the present invention.

FIG. 2 schematically illustrates a cross-section view of a lateral Schottky diode 200 with high breakdown voltage in accordance with an embodiment of the present invention. As shown in FIG. 2, the lateral Schottky diode 200 comprises: an anode A, a cathode C, a P-type substrate 13, an N-type buried layer 23, an epitaxial layer 210 formed on the substrate 13, a current region 22 formed in the epitaxial layer 210 and on the N-type buried layer 23, a P-type buried layer 12 formed beside the current region 22, a first N-type well 20 and a second N-type well 24 formed in the epitaxial layer 210, a third P-type well 11 formed beside the first N-type well 20 and on the current region 22, a P-type guard ring 10 formed in the first N-type well 20, a cathode region 14 formed in the second N-type well 24, an anode metal region 30 formed on the first N-type well 20 and on the P-type guard ring 10, a cathode metal region 31 formed on the cathode region 14, an isolated layer 40 formed between the anode metal region 30 and the cathode metal region 31, and the epitaxial layer 210 between the second N-type well 24 and the third P-type well 11 is a drift region 21.

In one embodiment, the P-type buried layer 12 is formed between the substrate 13 and the first N-type well 20. The third P-type well 11 does not touch the P-type buried layer 12, but touches the current region 22.

In one embodiment, the first N-type well 20 is coupled to the anode A, and the second N-type well 24 is coupled to the cathode C. The first N-type well 20 does not touch the second N-type well 24. Between the first N-type well 20 and the second N-type well 24 are the third well 11 and the drift region 21. In one embodiment, the doping concentration of the cathode region 14 is higher than the doping concentration of the N-type buried layer 23, the doping concentration of the N-type buried layer 23 is higher than the doping concentrations of the first N-type well 20 and the second N-type well 24, and the doping concentrations of the first N-type well 20 and the second N-type well 24 are higher than the doping concentration of the current region 22.

In one embodiment, the P-type guard ring 10 touches the third P-type well 11, and its doping concentration is higher than the third P-type well 11 in order to increase a width of depletion layer to improve the breakdown voltage. In one embodiment, the P-type well 11 is with light doping concentration. Besides, the third P-type well 10 can help to undertake a part of a reverse voltage, hence decreasing the doping concentration around the P-type guard ring 10 is not yet required to improve the breakdown voltage. Furthermore, the third P-type well 11 and the P-type guard ring 10 together can reduce the edge effect of electric field.

Therefore, when a reverse voltage is added on the Schottky diode 200, the third P-type well 11 and the current region 22 can help to undertake a part of the reverse voltage, and the lateral breakdown occurs in the third P-type well 11, the drift region 21 and the second N-type region 24 when the reverse voltage added on the Schottky diode 200 is equal to or higher than the breakdown voltage of the Schottky diode 200, meanwhile, the P-type buried layer 12 is configured to reduce the leakage current; and when the Schottky diode 200 is forward on, a forward current from the anode A to the cathode C flows through the first N-type well 20, the current region 22 and the second N-type well 24, meanwhile, the P-type buried layer 12 is configured to reduce the forward resistance.

In one embodiment, the cathode region 14 is with heavy doping concentration. The isolated layer 40 is configured to be a shallow trench. The drift region 21 is on the current region 22, and increasing a length of the drift region 21 can improve the breakdown voltage of the Schottky diode 200.

FIG. 3-FIG. 12 schematically illustrates cross-section views 001-010 of a lateral Schottky diode during a process of fabrication in accordance with an embodiment of the present invention.

Figure 3:
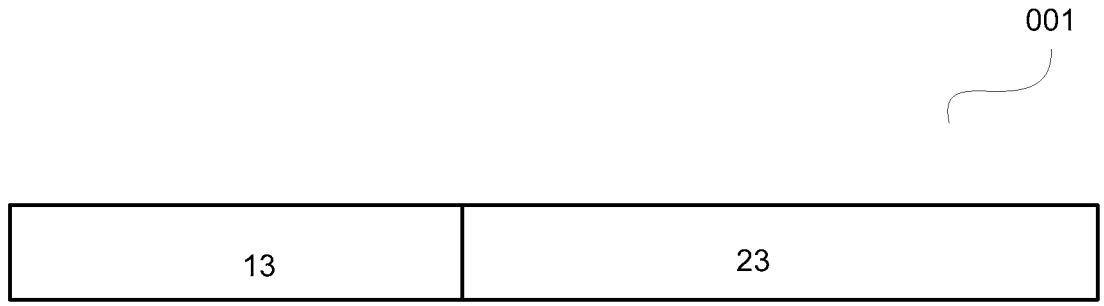
FIG. 3-FIG. 12 schematically illustrate cross-section views 001-010 of a lateral Schottky diode during a process of fabrication in accordance with an embodiment of the present invention.

As illustrated in FIG. 3, the cross-section view 001 shows that the process includes forming an N-type buried layer 23 in a P-type substrate 13. In one embodiment, the P-type substrate 13 is with heavy doping concentration.

Figure 4:
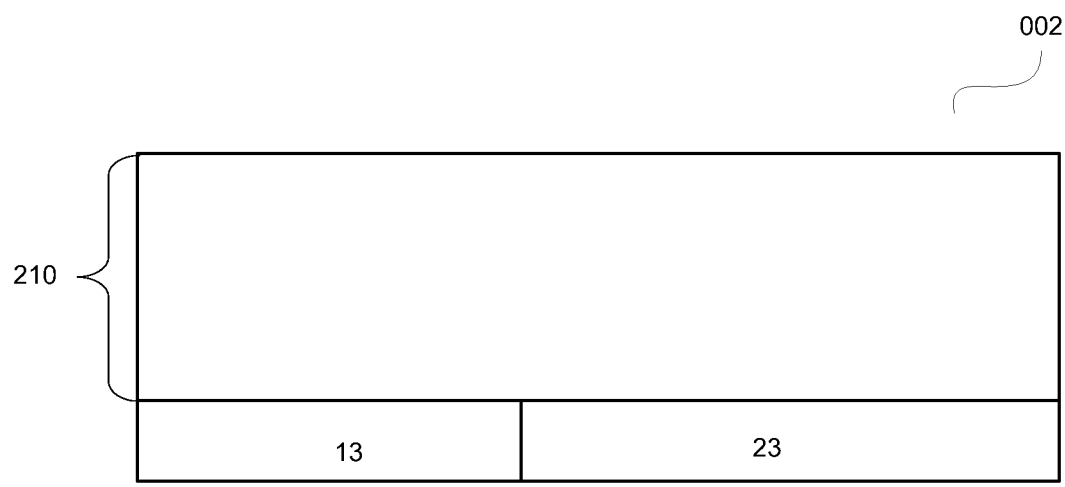

As illustrated in FIG. 4, the cross-section view 002 shows that the process includes forming an epitaxial layer 210 on the P-type substrate 13. In one embodiment, the epitaxial layer 210 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, during the forming of the epitaxial layer 210 and the following steps discussed later, the N-type buried layer 23 may get out-diffusion into the epitaxial layer 210.

Figure 5:
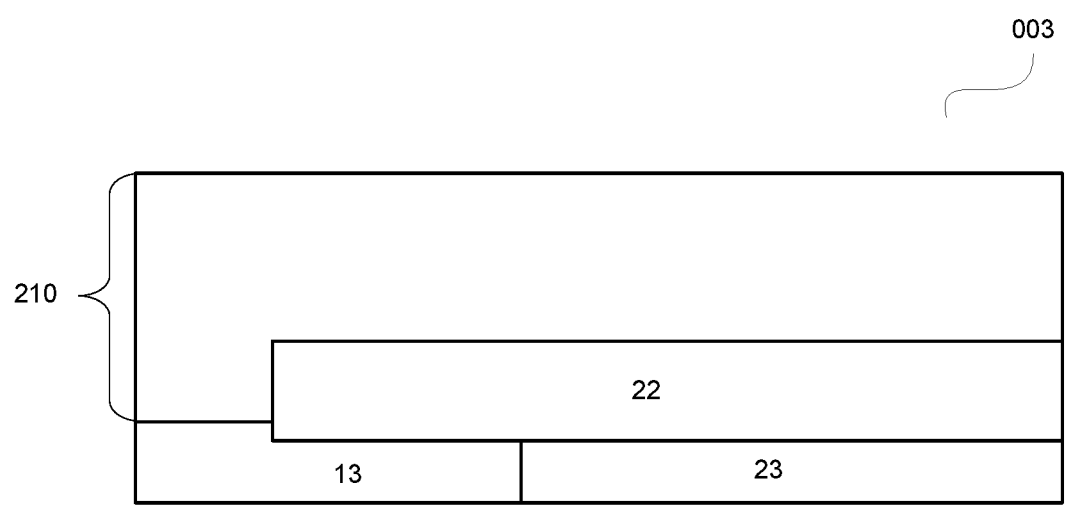

As illustrated in FIG. 5, the cross-section view 003 shows that the process includes forming an N-type current region 22 in the epitaxial layer 210 and on the N-type buried layer 23, wherein the doping concentration of the N-type current region 22 is higher than the epitaxial layer 210. In one embodiment, the N-type current region 22 can be formed by ion implantation.

Figure 6:
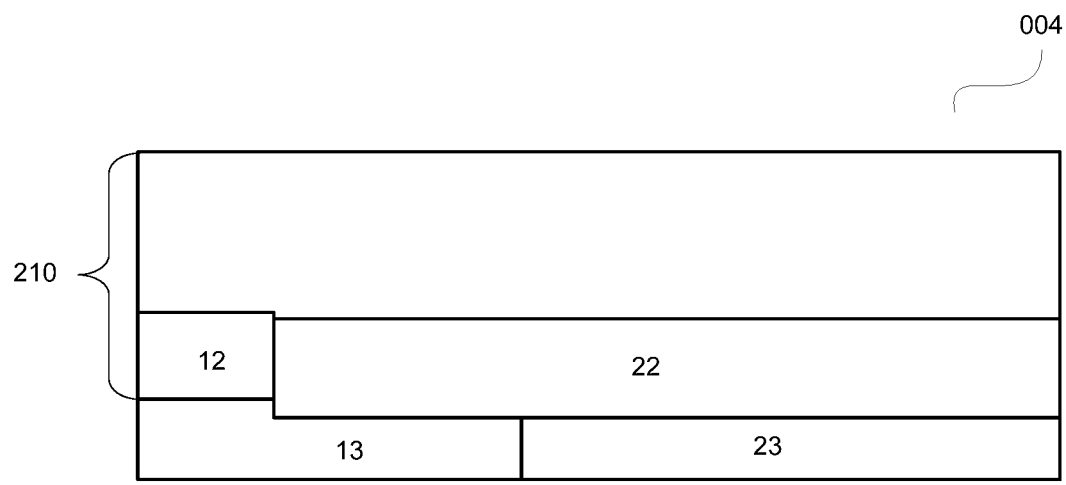

As illustrated in FIG. 6, the cross-section view 004 shows that the process includes forming a P-type buried layer 12 in the epitaxial layer 210 and beside the N-type current region 22. In one embodiment, the P-type buried layer 12 with reasonable doping concentration, length and thickness can help to reduce the forward resistance when the Schottky diode is forward on and reduce the leakage current when a reverse voltage is added on the Schottky diode.

Figure 7:
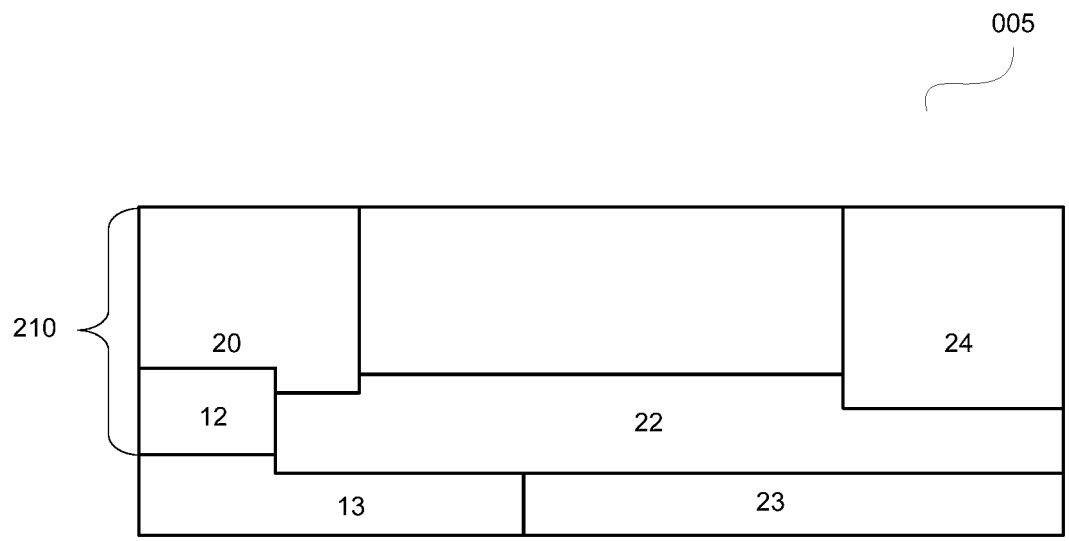

As illustrated in FIG. 7, the cross-section view 005 shows that the process includes forming a first N-type well 20 on the P-type buried layer 12 and forming a second N-type well 24 on the current region 22. Wherein the first N-type well 20 does not touch the second N-type well 24, and both the N-type well 20 and the second N-type well 24 touch the current region 22. In one embodiment, the doping concentration of the N-type well 20 is same with the second N-type well 24 and is higher than the doping concentration of the current region 22. In another embodiment, the doping concentrations of the N-type well 20 and the second N-type well 24 can be different. In one embodiment, when the Schottky diode is forward on, the first N-type well 20, the current region 22 and the second N-type well 24 provide a current path for the Schottky diode, i.e. a forward current from the anode A to the cathode C flows through the first N-type well 20, the current region 22 and the second N-type well 24.

Figure 8:
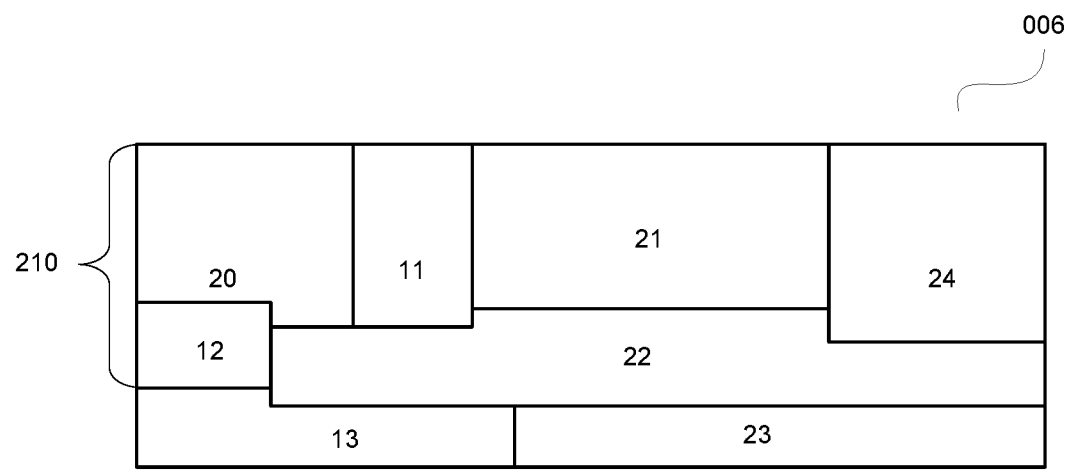

As illustrated in FIG. 8, the cross-section view 006 shows that the process includes forming a third P-type well 11 beside the first N-type well 20. Wherein the third P-type well 11 does not touch the P-type buried layer 12. In one embodiment, the third P-type well 11 can be formed by ion implantation or diffusion technology. The epitaxial layer 210 between the third P-type well 11 and the second N-type well 24 is a drift region 21, wherein increasing the length of the drift region 21 can improve the breakdown voltage. In one embodiment, the lateral breakdown occurs in the third P-type well 11, the drift region 21 and the second N-type region 24 when a reverse voltage added on the lateral diode is equal to or higher than the breakdown voltage.

Figure 9:
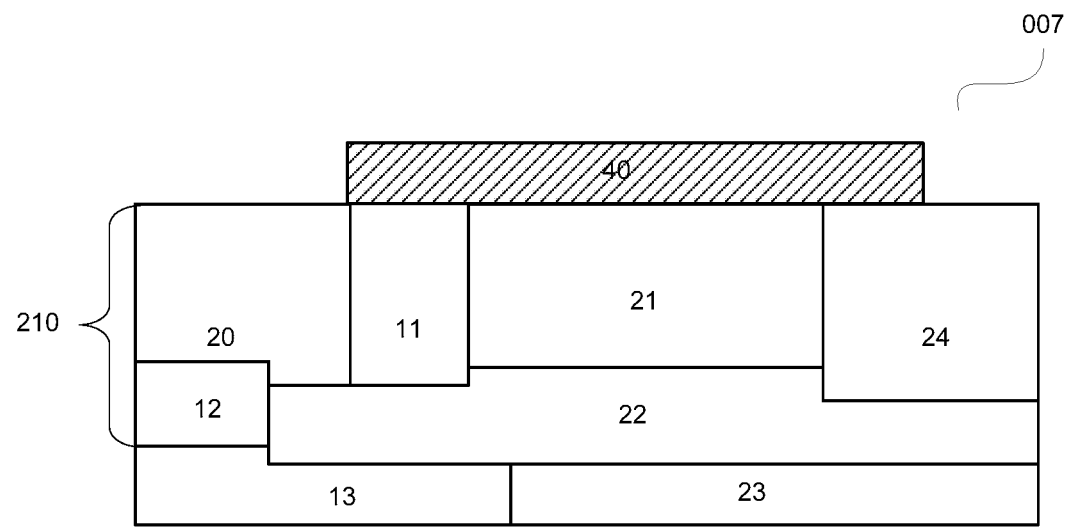

As illustrated in FIG. 9, the cross-section view 007 shows that the process includes forming an isolation layer 40 on the drift region 21. In one embodiment, part of the isolation layer 40 is on the first N-type well 20, part of the isolation layer 40 is on the second N-type well 24, part of the isolation layer 40 is on the third P-type well 11, and part of the isolation layer 40 is on the second N-type well 24. In one embodiment, the isolation layer 40 can be formed by deposition technology. In another embodiment, the isolation layer 40 can be formed by STI (Shallow Trench Isolation) technology.

Figure 10:
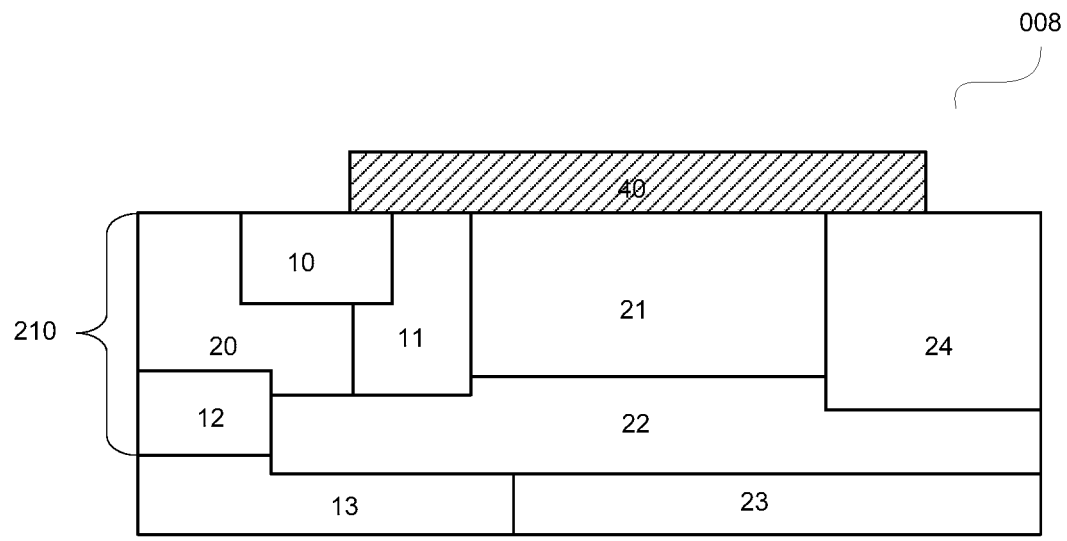

As illustrated in FIG. 10, the cross-section view 008 shows that the process includes forming a P-type guard ring 10 in the first N-type well 20 and beside the third P-type well 11. Wherein the doping concentration of the third P-type well 10 is less than the P-type guard ring 10 to increase a width of depletion layer to improve the breakdown voltage. In one embodiment, the third P-type well 11 and the P-type guard ring 10 together can reduce the edge effect of electric field. In one embodiment, the P-type guard ring 10 is with a heavy doping concentration. In one embodiment, the P-type guard ring 10 may get out-diffusion into the third P-type well 11.

Figure 11:
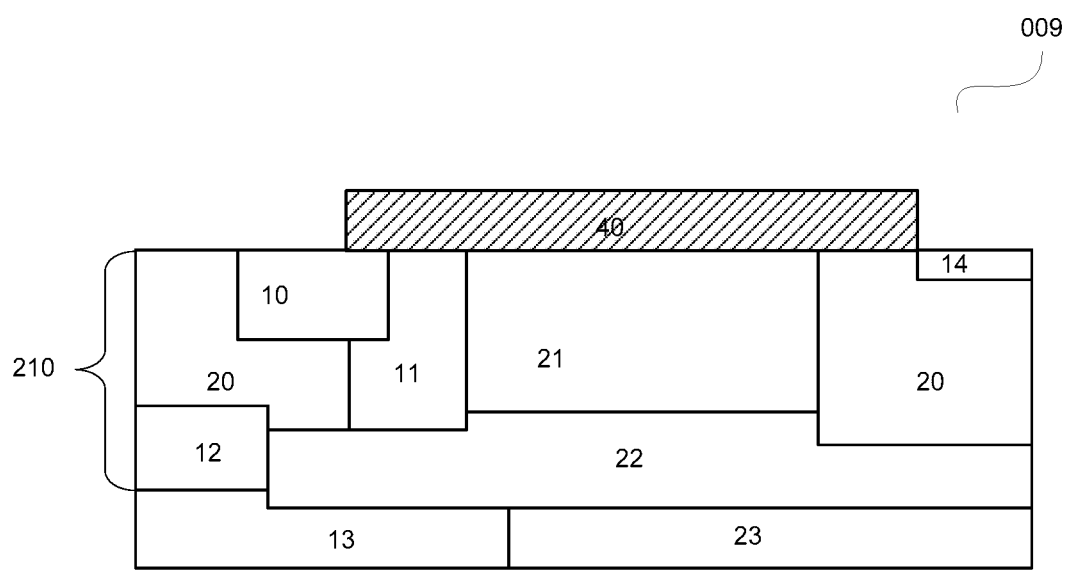

As illustrated in FIG. 11, the cross-section view 009 shows that the process includes forming an N-type cathode region 14 with a heavy doping concentration in the second N-type well 20.

Figure 12:
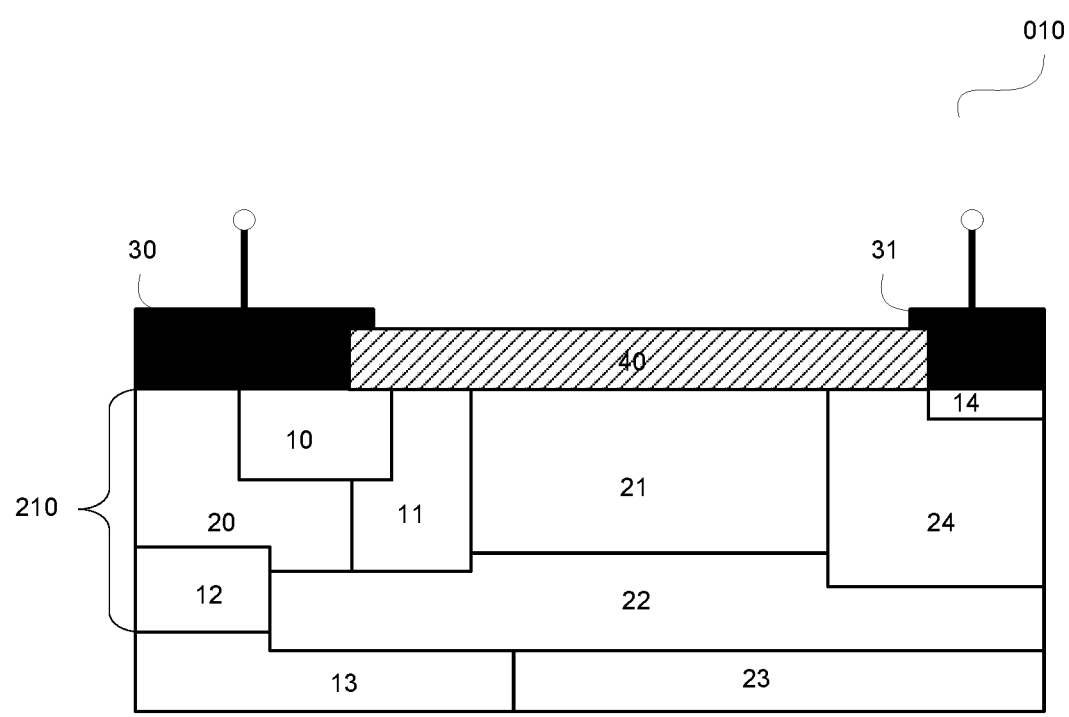

As illustrated in FIG. 12, the cross-section view 010 shows that the process includes forming an anode metal region 30 on the first N-type well 20 and the P-type guard ring 10, and forming a cathode metal region 31 on the N-type cathode region 14.

The above structures or parts are mentioned either in N type or P type. However, the doping type for the structures or parts in each embodiment can be the opposite.

The above description and discussion about specific embodiments of the present invention is for purposes of illustration. However, one with ordinary skill in the relevant art should know that the invention is not limited by the specific examples disclosed herein. Variations and modifications can be made on the apparatus, methods and technical design described above. Accordingly, the invention should be viewed as limited solely by the scope and spirit of the appended claims.

We claim:

1. A lateral diode, having an anode and a cathode, comprising:
   a substrate, having a first conductivity type;
   an epitaxial layer, having a second conductivity type, wherein the epitaxial is formed on the substrate;
   a current region, having the second conductivity type, the current region is formed in the epitaxial layer and on the substrate;
   a first buried layer, having the first conductivity type, wherein the first buried layer is formed beside the current region and in the epitaxial layer;
   a first well, having the second conductivity type, wherein the first well is coupled to the anode and is formed on the first buried layer and on the current region, wherein the first well touches the current region;
   a second well, having the second conductivity type, wherein the second well is coupled to the cathode and is formed on the current region;
   a third well, having the first conductivity type, wherein the third well is formed beside the first well and on the current region, wherein the third well does not touch the first buried layer; and
   a guard ring, having the first conductivity type, wherein the guard ring is formed in the first well and beside the third well.

2. The lateral diode according to claim 1, wherein a region between the second well and the third well is a drift region, and a lateral breakdown occurs in the third well, the drift region and the second well when a reverse voltage added on the lateral diode is equal to or higher than a breakdown voltage.

3. The lateral diode according to claim 1, wherein a doping concentration of the current region is higher than a doping concentration of the epitaxial layer.

4. The lateral diode according to claim 1, wherein a doping concentration of the guard ring is higher than a doping concentration of the third well.

5. The lateral diode according to claim 1, wherein the first buried layer is configured to adjust a leakage current when a reverse voltage is added on the lateral diode.

6. The lateral diode according to claim 1, wherein the first buried layer is configured to adjust a forward resistance when the lateral diode is forward on.

7. The lateral diode according to claim 1, wherein the current region is configured to undertake a part of a reverse voltage.

8. The lateral diode according to claim 1, wherein the third well and the guard ring are configured to reduce an edge effect of electrical field.

9. The lateral diode according to claim 1, wherein a current from the anode to the cathode flows through the first well, the current region and the second well.

10. The lateral diode according to claim 1, wherein doping concentrations of the first well and the second well are higher than a doping concentration of the current region.

11. The lateral diode according to claim 1, further comprising a second buried layer, having a second conductivity type, wherein the second buried layer is formed below the current region, wherein a doping concentration of the second buried layer is higher than doping concentrations of the first well and the second well.

12. The lateral diode according to claim 1, further comprising a cathode contact region, having a second conductivity type, wherein the cathode contact region is formed in the second well and is coupled to the cathode, wherein the cathode contact region is with heavy doping concentration.

13. A lateral diode, having an anode and a cathode, comprising:
   a substrate, having a first conductivity type;
   an epitaxial layer, having a second conductivity type, wherein the epitaxial layer is formed on the substrate;
   a current region, having the second conductivity type, wherein the current region is formed in the epitaxial layer and on the substrate;

a first well, having the second conductivity type, wherein the first well is coupled to the anode;

a second well, having the second conductivity type, wherein the second well is coupled to the cathode;

a third well, having the first conductivity type, wherein the third well is formed beside the first well and is with light doping concentration; and a guard ring, having the first conductivity type, wherein the guard ring is formed in the first well and beside the third well, wherein the guard ring is with heavy doping concentration; wherein between the third well and the second well is a drift region, and a lateral breakdown occurs in the third well, the drift region and the second well when a reverse voltage added on the lateral diode is equal to or higher than a breakdown voltage.

14. The lateral diode according to claim 13, further comprising a buried layer, having the first conductivity type, wherein the buried layer is formed below the first well and beside the current region, and the buried layer does not touch the third well.

15. The lateral diode according to claim 14, wherein the buried layer is configured to adjust a leakage current when a reverse voltage is added on the lateral diode, and is configured to adjust a forward resistance when the lateral diode is forward on.

16. The lateral diode according to claim 13, wherein the third well and the guard ring are configured to reduce an edge effect of electrical field.

17. The lateral diode according to claim 1, wherein a current from the anode to the cathode flows through the first well, the current region and the second well.

18. A method for forming a lateral diode, wherein the lateral diode has an anode and a cathode, the method comprising:

forming an epitaxial layer on a substrate, wherein the substrate has a first conductivity type and the epitaxial layer has a second conductivity type;

forming a current region having a second conductivity type on the substrate and in the epitaxial layer;

forming a first buried layer on the substrate and beside the current region;

forming a first well and a second well on the current region, wherein the first well is coupled to the anode, the second well is coupled to the anode, and both the first well and the second well have the second conductivity type;

forming a third well beside the first well, wherein the third well has the first conductivity type, and the third well does not touch the first buried layer; and forming a guard ring in the first well and beside the third well, wherein the guard ring has the first conductivity type and is with a heavy doping concentration.

19. The method for forming a lateral diode according to claim 18, wherein the first buried layer is formed between the substrate and the first well, and the third well touches the current region.

20. The method for forming a lateral diode according to claim 18, further comprising: forming a second buried layer in the substrate and below the current region.

21. The method for forming a lateral diode according to claim 18, further comprising: forming a cathode region with a heavy doping concentration of the second conductivity type in the second well.

22. The method for forming a lateral diode according to claim 18, wherein a current from the anode to the cathode flows through the first well, the current region and the second well.

23. The method for forming a lateral diode according to claim 18, wherein between the third well and the second well is a drift region, and a lateral breakdown occurs in the third well, the drift region and the second well when a reverse voltage added on the lateral diode is equal to or higher than a breakdown voltage.

* * * * *